United States Patent
Scheibner

(10) Patent No.: US 9,705,081 B2
(45) Date of Patent: Jul. 11, 2017

(54) ELECTRIC FIELD CONTROL ELEMENT FOR PHONONS

(71) Applicant: The Regents of the University of California, Oakland, CA (US)

(72) Inventor: Michael Scheibner, Merced, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/115,175

(22) PCT Filed: Jan. 30, 2015

(86) PCT No.: PCT/US2015/013915
§ 371 (c)(1),
(2) Date: Jul. 28, 2016

(87) PCT Pub. No.: WO2015/117003
PCT Pub. Date: Aug. 6, 2015

(65) Prior Publication Data
US 2016/0351807 A1 Dec. 1, 2016

Related U.S. Application Data

(60) Provisional application No. 61/934,532, filed on Jan. 31, 2014.

(51) Int. Cl.
*H01L 49/00* (2006.01)
*H01L 29/872* (2006.01)
(Continued)

(52) U.S. Cl.
CPC .......... *H01L 49/006* (2013.01); *H01L 29/127* (2013.01); *H01L 29/16* (2013.01);
(Continued)

(58) Field of Classification Search
CPC ... H01L 29/872; H01L 29/127; H01L 49/006; H01L 29/20; H01L 29/475; H01L 29/66143; H01L 29/16; H01L 33/0033
See application file for complete search history.

(56) References Cited

U.S. PATENT DOCUMENTS

| 5,608,231 A | 3/1997 | Ugajin et al. |
| 5,679,961 A | 10/1997 | Higurashi et al. |

(Continued)

FOREIGN PATENT DOCUMENTS

| WO | WO-02/33758 A1 | 4/2002 |
| WO | WO 2012/158791 A2 | 11/2012 |
| WO | WO-2015/117003 A1 | 8/2015 |

OTHER PUBLICATIONS

"International Application Serial No. PCT/US2015/013915, International Preliminary Report on Patentatbility mailed Aug. 11, 2016", 8 pgs.

(Continued)

*Primary Examiner* — Yasser A Abdelaziez
(74) *Attorney, Agent, or Firm* — Schwegman Lundberg & Woessner, P.A.

(57) ABSTRACT

Generally discussed herein are techniques for and systems and apparatuses configured to control phonons using an electric field. In one or more embodiments, an apparatus can include electrical contacts, two quantum dots embedded in a semiconductor such that when an electrical bias is applied to the electrical contacts, the electric field produced by the electrical bias is substantially parallel to an axis through the two quantum dots, and a phononic wave guide coupled to the semiconductor, the phononic wave guide configured to transport phonons therethrough.

11 Claims, 11 Drawing Sheets

(51) Int. Cl.
   *H01L 29/12*   (2006.01)
   *H01L 29/16*   (2006.01)
   *H01L 29/20*   (2006.01)
   *H01L 29/47*   (2006.01)
   *H01L 29/66*   (2006.01)
   *H01L 33/00*   (2010.01)

(52) U.S. Cl.
   CPC ............ *H01L 29/20* (2013.01); *H01L 29/475* (2013.01); *H01L 29/66143* (2013.01); *H01L 29/872* (2013.01); *H01L 33/0033* (2013.01)

(56) References Cited

U.S. PATENT DOCUMENTS

| | | | |
|---|---|---|---|
| 5,917,194 | A | 6/1999 | Dutta et al. |
| 5,936,258 | A * | 8/1999 | Imamura ................ B82Y 10/00 257/14 |
| 8,525,228 | B2 | 9/2013 | Javey et al. |
| 2009/0007950 | A1 | 1/2009 | Stefanescu et al. |
| 2009/0283751 | A1 | 11/2009 | Yang et al. |
| 2010/0181551 | A1 | 7/2010 | Holme et al. |
| 2010/0308303 | A1 * | 12/2010 | Chang .................... B82Y 10/00 257/15 |
| 2011/0067752 | A1 | 3/2011 | Fafard |
| 2012/0061728 | A1 | 3/2012 | Javey et al. |
| 2014/0150860 | A1 * | 6/2014 | Morr ....................... H01L 22/12 136/255 |
| 2014/0326902 | A1 * | 11/2014 | Tahan ................... H01L 49/006 250/493.1 |
| 2015/0340521 | A1 * | 11/2015 | Kempa ............. H01L 31/02168 136/256 |

OTHER PUBLICATIONS

"International Application Serial No. PCT/US2015/013915, International Search Report mailed Apr. 14, 2015", 2 pgs.

"International Application Serial No. PCT/US2015/013915, Written Opinion mailed Apr. 14, 2015", 6 pgs.

Hameau, S., et al., "Strong Electron-Phonon Coupling Regime in Quantum Dots", *Physical Review Letters*, 83(20), (1999), 4152-4155.

Hatanaka, D., et al., "A phonon transistor in an electromecanical resonator array", *Appl. Phys. Lett.*, 102(21), 213102, (2013), 3 pgs.

Kerfoot, M. et al., "Single Phonon Transport Between Quantum Dots", Center of Integrated Nanomechanical Systems, National Science Founation, (Apr. 25, 2012), 1 pg.

Kerfoot, Mark L. et al., "Optophonics with Coupled Quantum Dots", *Nature Communications*, 5, doi: 10.1038/ncomms4299, (2014), 1-6.

Maldovan, Martin, "Narrow Low-Frequency Spectrum and Heat Management by Thermocrystals", *Physical Review Letters*, 110, 035902, (2013), 1-5.

Maldovan, Martin, "Sound and heat revolutions in phononics", *Nature*, vol. 503, (Nov. 14, 2013), 209-217.

Menezes, Marcos G., et al., "Proposal for a single-molecule field-effect transistor for phonons", *Physical Review B* 81(1), 012302, (2010), 1-4.

Scheibner, Michael, et al., "Quantum Dot Molecules: More is different . . . ", Stanford, (Jul. 20, 2012), 45 pgs.

Scheibner, Michael, "Tailoring optical properties via controlled coupling in quantum dot systems", *New Laser Scientist Conference*, (Oct. 18, 2012), 18 pgs.

* cited by examiner

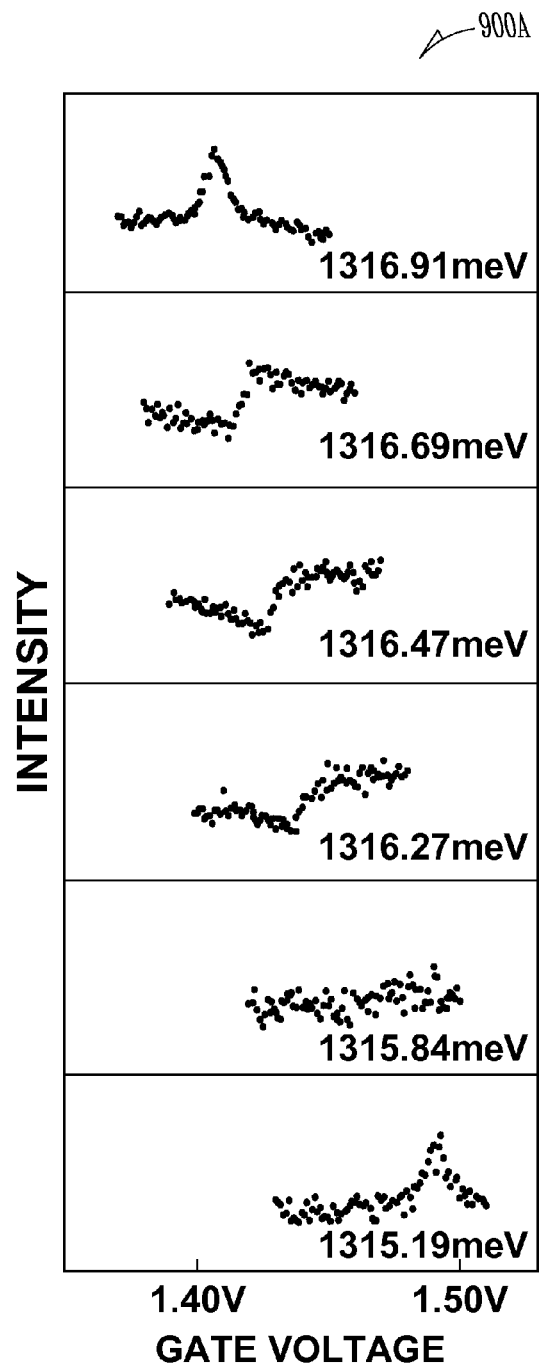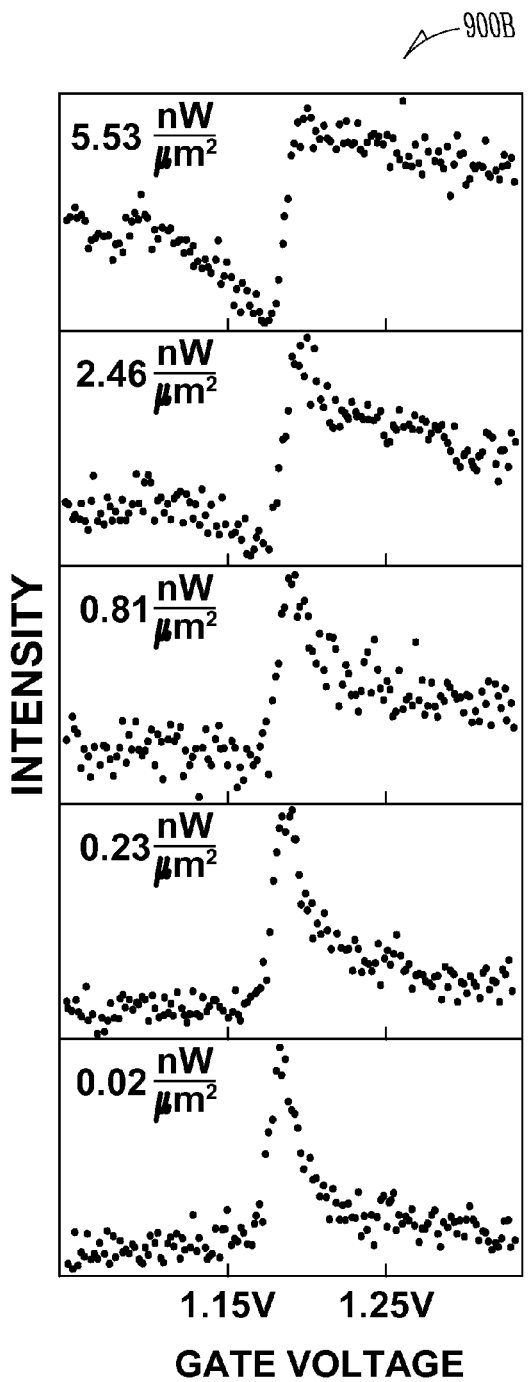
Fig. 9A
Fig. 9B

US 9,705,081 B2

ELECTRIC FIELD CONTROL ELEMENT FOR PHONONS

CLAIM OF PRIORITY

This patent application is a U.S. National Stage Filing under 35 U.S.C. 371 from International Application No. PCT/US2015/013915, filed on Jan. 30, 2015, and published as WO 2015/117003 A1 on Aug. 6, 2015, which claims the benefit of priority of U.S. Provisional Patent Application Ser. No. 61/934,532, filed on Jan. 31, 2014, each of which is hereby incorporated by reference herein in its entirety.

GOVERNMENT RIGHTS

This invention was made with government support under Grant No. 0832819 awarded by the National Science Foundation. The government has certain rights in the invention.

BACKGROUND

Phonons, quantized vibrations of an elastic structure, permeate the crystalline components of modern technology, and are central to the emerging research area termed "phononics". Associated with heat lost energy and noise, phonons are encountered as such in many electronic devices used in daily life. Phonons are considered to govern fundamental phenomena on the quantum level, such as relaxation dynamics in nanostructures to superconductivity. In the development of solid state quantum technologies phonons are mainly considered for the limitations they impose.

BRIEF DESCRIPTION OF DRAWINGS

Various ones of the appended drawings illustrate embodiments of the subject matter presented herein. The appended drawings are provided to allow a person of ordinary skill in the art to understand the concepts disclosed herein, and therefore cannot be considered as limiting a scope of the disclosed subject matter.

FIGS. 9A and 9B show a plurality of scatter plots of phonon intensity at the drain of the transistor of FIG. 7 vs. the voltage at the gate of the transistor.

DETAILED DESCRIPTION

Figure 1:
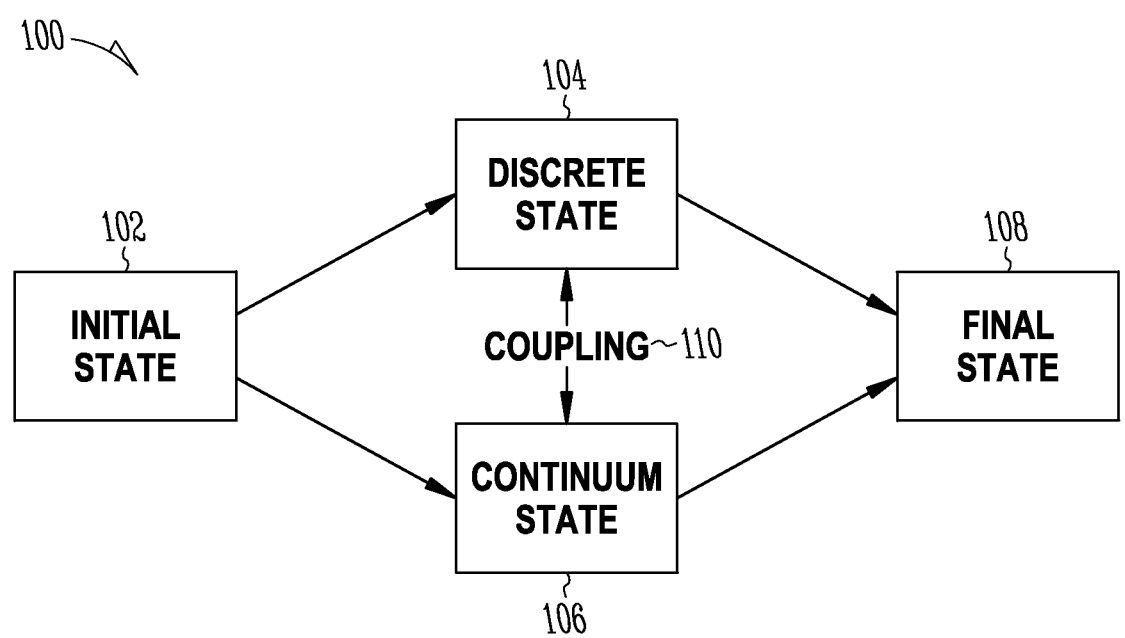
FIG. 1 shows an example of a transition state diagram for a pair of zero-dimensional structures.

The description that follows includes illustrative apparatuses, systems, methods, and techniques that embody various aspects of the subject matter described herein. In the following description, for purposes of explanation, numerous specific details are set forth to provide an understanding of various embodiments of the subject matter. It will be evident, however, to those skilled in the art that embodiments of the subject matter may be practiced without at least some of these specific details.

This disclosure relates generally to the field of phonon control and more specifically to systems, apparatuses, and methods related to a control mechanism for phonons.

Omnipresent electron-phonon interactions and the predominantly dissipative nature of phonons are a major source of decoherence of the atom-like quantum state hosted by low-dimensional solid state structures, such as zero-dimensional structures like quantum dots (QDs). In contrast, conditions in which phonons can be made non-dissipative or coherent are discussed herein. A result is a variety of control mechanisms (e.g., field-effect transistors) that can control phonons ("phonon FETs"). The phonon FETs can be implemented in a conventional integrated circuit device architecture individually or in combination.

Discussed herein is a tool that can control the generation or flow of a phonon. Like a field-effect transistor (FET) controls the flow of electrons or electricity ("electric FET"), apparatuses and systems discussed herein can control the flow of conductive heat (a phonon) via an electric field produced using an electric potential or electrical bias (e.g., a voltage). The physical structure of the phonon FET can include a pair of quantum dots embedded in a conventional semiconductor material or device (e.g., a Schottky diode, capacitor, a PIN-diode, or other semiconductor technology). A Schottky diode and a simple capacitor-like structure (see FIG. 2) are described herein, however, the disclosure can be used in a variety of semiconductor and other electric or electronic devices. An electric bias can be applied so as to create an electric field along or substantially parallel to an axis through or connecting the dot pair. Phonons can pass through the pair of quantum dots on two paths, such as to cause interference between phonons on each path. Depending on the electric bias applied, this interference can be constructive (phonon flow is enabled or enhanced) or destructive (phonon flow is inhibited or blocked). This structure can perform the function of a phonon switch that is based on the applied electric bias (i.e. the electric field that is produced by applying the electric bias). A fundamental principle that governs the phonon interaction is a Fano-type quantum interference that creates a resonant polaron, which in this case is a molecular polaron.

An advantage of the phonon FET can include an increased energy efficiency. Another advantage of the phonon FET can include the ability to make use of a phonon rather than to let it go to waste as heat, such as in a conventional integrated circuit or other semiconductor technology. For example, the controlled phonon can be representative of data where a presence or absence of the phonon indicates a bit of "1" or "0" so as to perform a function similar to that of an electron in a current electronic system, thus supplanting the electron or supplementing the information provided by the electron.

The phonon control mechanism (e.g., phonon FET) can be used to control the flow of phonon heat so as to increase an efficiency in which heat is dissipated or increased or to more precisely direct a flow of heat. The phonon control mechanism can be used as an interface between photonic logic (light based, for example fiber optic), electronic logic (electron based logic), phononic logic (phonon based logic), or spintronics (spin based logic). The phonon control mechanism can be used in quantum information technologies (e.g., for revealing coherent coupling between quantum structures). The phonon control mechanism can be used as a logic element in an information system (e.g., a solid state based information system) or processing technology, such as by using the phonon control mechanism as a logic switch. The phonon control mechanism can reduce noise caused by a phonon and can be used in an application to exploit its noise reducing ability, such as in a sensor or detector technology (e.g., light or TeraHertz radiation detector). Yet another application of the phonon control mechanism is in the field of solar technology where a high light absorption and reduced thermal emmittance can be advantageous, such as can be provided by the phonon control mechanism. The phonon control mechanism can be used in a strain or motion sensor, such as is discussed in more detail herein.

Reference will now be made to the FIGS. to describe further details of apparatuses and systems and techniques (e.g., methods) that can include a phonon control mechanism.

FIG. 1 shows a block diagram of a state diagram 100 of a phonon. The phonons can begin in a medium (e.g., a solid, liquid, or gas) that is an initial state 102. From the initial state 102 the medium can transition through a discrete state 104 or a continuum state 106 to a final state 108.

Some mechanism (the mechanism is not shown in FIG. 1) can generate an energy that causes a phonon to be produced in a semiconductor or dielectric material of a device that is in the initial state 102. After the phonon has passed through at least a portion of the semiconductor or dielectric material, semiconductor or dielectric material can be in the final state 108.

If the medium offers two indistinguishable paths (e.g., one path through the discrete state 104 and another path through the continuum state 106) interference can occur. This interference can be constructive, meaning a phonon can be generated (e.g., and emitted) and the final state 108 is reached, or destructive meaning a phonon is not generated or released again and the final state 108 is not reached. The discrete state 104 and the continuum state 106 can be coupled (e.g., in resonance with each other), such as through the coupling 110. A medium that offers such indistinguishable paths can create a "which-path" problem, similar to a double slit experiment, and can cause Fano-type quantum interference (i.e. a Fano-effect). By controlling the interference of the phonon with a gating mechanism (e.g., an electric field), a phonon transistor can be created.

Figure 2:
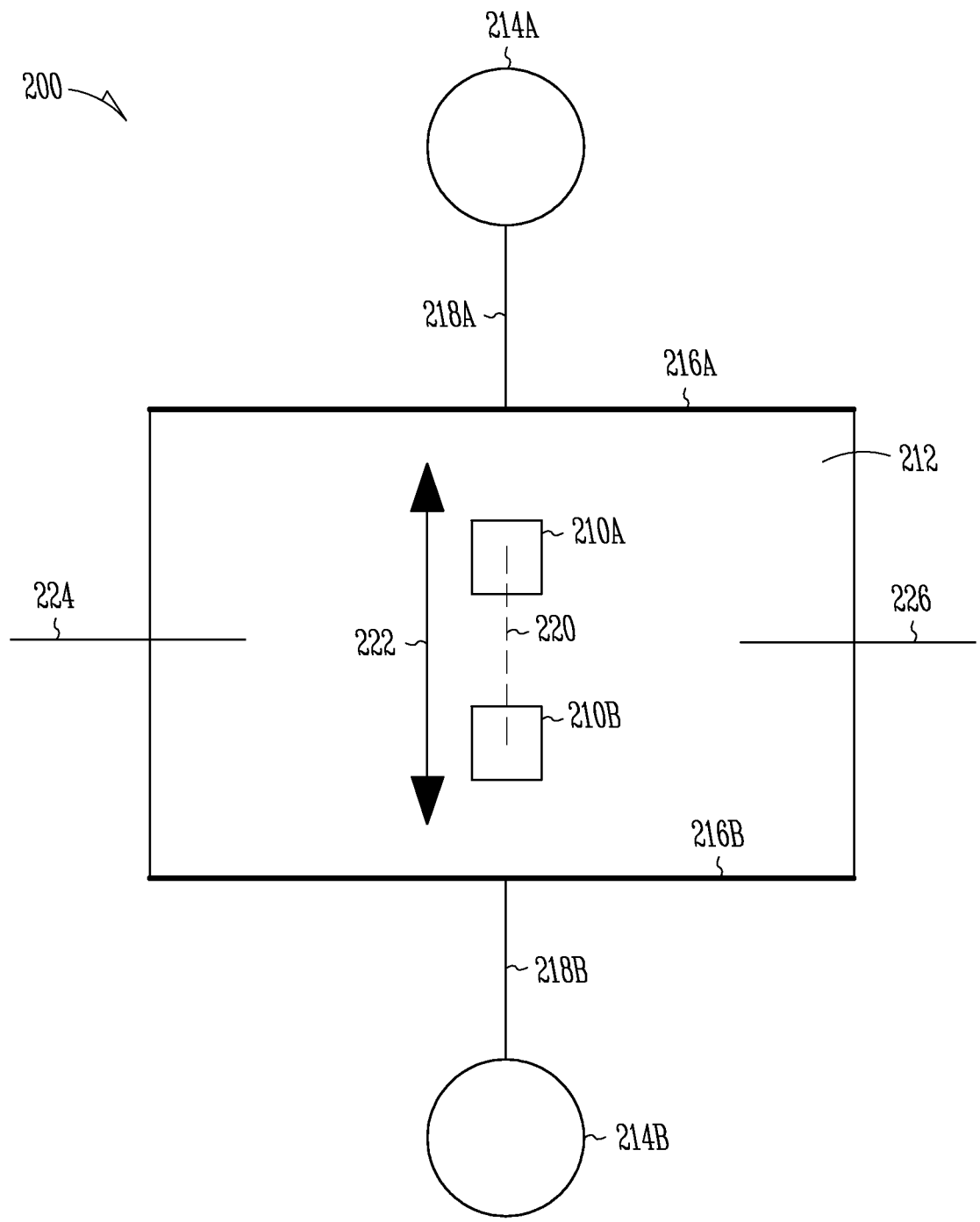
FIG. 2 shows a block diagram of an example of a device configured to control generation or destruction of a phonon.

FIG. 2 shows an example of a device 200 configured to include a phonon control mechanism. The device 200 can include two or more zero-dimensional structures 210A and 210B embedded in a semiconductor material 212 (e.g., solid state material) or other electrically conductive or electrically insulating material. The device 200 can include a source lead element 224 and a drain lead element 226. The device 200 can basically be a capacitor with some dielectric or semiconductor material 212 sandwiched between plates of the capacitor (in this case the contacts 216A and 216B provide the plates of the capacitor). The semiconductor material 212 can also be a dielectric material which allows an electric field to be generated therein or a material that includes a band gap in the presence of an electric field, where different states of the band gap can be reached.

The device 200 can include a gating mechanism through which an electric bias can be applied to the semiconductor material 212. The gating mechanism shown in FIG. 2 includes two electrically conductive contacts 216A and 216B coupled to one or more conductive Input/Output (I/O) pads 214A and 214B, respectively. FIG. 2 shows the contacts 216A-216B coupled to the pads 214A-B through an electrically conductive interconnect 218A-218B, respectively. In one or more embodiments, an electrical potential bias can be applied directly to the contact 216A-B rather than applying the bias to the I/O pad 214A-B or interconnect 218A-B.

The zero-dimensional structures 210A-B can include a quantum dot or a Nitrogen Vacancy (NV) center. The quantum dot can include materials similar to or the same as semiconductor material 212. In an embodiment where the zero-dimensional structure 210A-B includes an NV center, the semiconductor material 212 can be diamond. A quantum dot can be on the order of tens of nanometers or less. A quantum dot is a semiconductor that has zero or more charges confined in all three spatial dimensions (i.e. length, width, and height), comparable to the extension of the wave function/deBroglie wavelength of the charge, thus, the quantum dot is a zero-dimensional structure. A quantum dot is a nanocrystal, typically including a semiconductor material. A quantum dot is configured to exhibit quantum mechanical properties.

The zero-dimensional structures 210A-B can be atom-like structures. The zero-dimensional structures 210A-B can be embedded, at least partially, in the semiconductor material 212 so as to provide the possibility to create a which-path problem for phonons, such as is described with regard to FIG. 1. The zero-dimensional structures 210A-B can represent possible paths through which phonon generation, emission, or destruction can occur. The semiconductor material 212 together with a zero-dimensional structure 210A can provide the continuum state 106, and the other zero-dimensional structure 210B can provide the discrete state 104. In one or more embodiments, the zero-dimensional structure 210A alone can provide the continuum state 106 and the other zero-dimensional structure 210B can provide the discrete state 104.

The zero-dimensional structures 210A-B can be separated by between about one and one hundred nanometers. In one or more embodiments, the separation between the zero-dimensional structures 210A-B can be between about one and thirty nanometers. The separation between the zero-dimensional structures 210A-B can be dependent on the material the zero-dimensional structures 210A-B are fabricated using and whether the zero-dimensional structures 210A-B are side-by-side (e.g., horizontally adjacent to one another) or on top of each other (e.g., vertically adjacent to one another). The zero-dimensional structures 210A-B can be separated by a larger distance if they are side-by-side. This is due, at least in part, to the processes that can be used to place the zero-dimensional structures 210A-B in the semiconductor material 212. In the side-by-side configuration, the zero-dimensional structures 210A-B can be placed with a high precision using a site controlled growth technique.

The semiconductor material 212 can be a semiconductor that includes positively or negatively doped, undoped, or intrinsic silicon, germanium, carbon, or a combination thereof. The semiconductor material 212 can include a compound that includes a compound that is a semiconductor, such as indium arsenide (a compound including indium and arsenic), gallium arsenide (a compound including gallium and arsenic), cadmium selenide, zinc selenide, or other compound semiconductor material. The semiconductor material 212 can include cadmium, indium, gallium, nitrogen, phosphorus, antimony, selenium, tellurium, oxygen, sulfur, graphene, diamond, glass, oxide, chlorine, titanium, lead, manganese, nickel, iron, chromium, silicon, silver, platinum, iodine, thallium, bromine, or a combination thereof. The semiconductor material 212 can include other semiconductor materials, such as a metal compound including multiple of the additives discussed. Note that an insulator (e.g., dielectric), such as glass, oxide, or diamond, can be used in place of or in conjunction with the semiconductor material 212.

The contact 216A-B, interconnect 218A-B, or I/O pad 214A-B can include a material such as a metal, semiconductor, or other electrically conductive material.

Different potentials may be supplied to the contacts 216A-B (e.g., directly to the contacts 216A-B or indirectly to the contacts 216A-B, such as through the I/O pad 214A-B or interconnect 218A-B), such as to provide an electric potential across the zero-dimensional structures 210A-B. An electric field line 222 of an electric field produced through the different supplied potentials can be substantially parallel to an axis 220 through the zero-dimensional structures 210A-B. The electric field line 222 can be coaxial with the axis 220. Note that FIG. 2 depicts the electric field line 222 parallel to and not coaxial with the axis 220. The electric bias applied to the contact 216 can provide a gating mechanism that can prohibit, promote, or inhibit phonon generation, dissipation, or transport. By varying the electric bias applied to the contacts 216A-B, constructive or destructive interference can be realized. For example, when a first voltage is applied to the contacts 216A-B, constructive interference between quantum states of the zero-dimensional structures 210A-B (and the semiconductor material 212) can be created and a phonon can be produced. When a second, different voltage is applied to the contacts 216A-B, destructive interference between quantum states of the zero-dimensional structures 210A-B can be created and a phonon can be prevented from being produced, dissipated, or transmitted.

The lead element 224 can include a phonon transport (e.g., heat) element, a photonic transport (e.g., optical) element, an electronic charge transport element, or a spintronic transport element. The lead element 224 can be configured to transport an excitation energy to the semiconductor material 212. The lead element 226 can include a phonon transport element, a photonic transport element, an electronic charge transport element, or a spintronic transport element. The lead element 226 can be configured to transport energy away from the semiconductor material 212.

Figure 3:
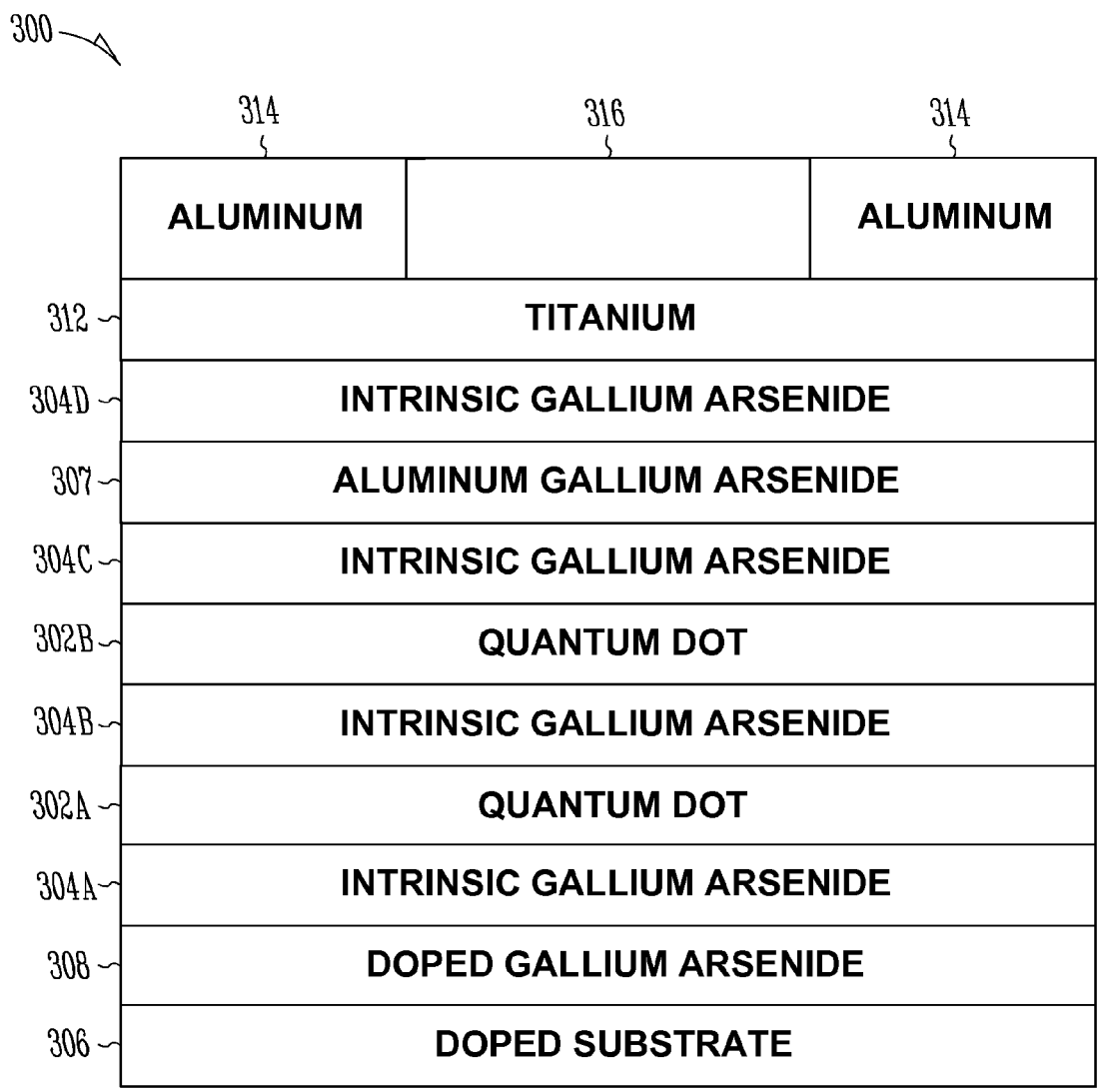
FIG. 3 shows an example of a Schottky diode configured to control generation or destruction of a phonon.

FIG. 3 shows an example of a Schottky diode 300 with a pair of quantum dots including quantum dot material 302A and 302B (e.g., zero-dimensional structures) embedded therein. Note that FIG. 3 is a specific implementation of the device 200 of FIG. 2 that is meant to illustrate that the capacitor-like device can be implemented in a variety of devices or structures that are capacitor-like as previously described. The Schottky diode 300 can be a heterostructure of different semiconductor layers and one or more contacts 216A-B. A first contact 216A (e.g., the aluminum 314 or titanium 312) of the Schottky diode 300 can be fabricated with one or more apertures 316 (e.g., transparent or semi-transparent apertures) therethrough. The aperture 316 can provide an optical access to quantum dots (e.g., quantum dot pairs) or other portions of the Schottky diode 300, such as to provide excitation energy to the Schottky diode 300. While FIG. 3 shows only one aperture 316, other apertures can be formed through the aluminum 314 or titanium 312 layers. In one or more embodiments that include a high resolution fabrication technique, such as an embodiment including Scanning Near Field Optical Microscopy (SNOM) or sight-controlled grown zero-dimensional structures in a photonic waveguide or cavity, the aperture 316 may be unnecessary to provide excitation energy or remove phonons (see discussion of FIG. 7 and how the aperture 316 can act as a lead element 224 or 226).

The Schottky diode 300 can include a substrate 306. Layers of intrinsic gallium arsenide 304A, 304B, 304C, and 304D can be situated over the substrate 306. The layers of intrinsic gallium arsenide 304A-D can be separated by the quantum dot material 302A-B or a layer of aluminum gallium arsenide 307. The Schottky diode 300 can include a layer of titanium 312 or one or more layers of aluminum 314 situated over the layers of intrinsic gallium arsenide 304A-D. The aluminum 314 or titanium 312 can form a contact 216A-B through which an electric bias can be applied to the Schottky diode 300. The substrate 306 can be coupled to an electric potential, such as a ground, so as to provide an electric potential difference between the aluminum 314 and the substrate 306. The substrate 306 can act as an electrical contact 216A-B. The electric potential difference can cause quantum states of the portions of quantum dot materials 302A-B to couple or resonate.

The quantum dot material 302A-B can be on the order of less than ten nanometers thick. In one or more embodiments, the quantum dot materials 302A-B can be between about two (2) and three (3) nanometers thick. In one or more embodiments, the quantum dot materials 302A and 302B can be separated by about four nanometers. The thickness of the quantum dot materials 302A-B can be bigger than three nanometers as long as they remain zero-dimensional, as discussed herein. The separation between the quantum dot materials 302A-B can be greater or less than four nanometers as previously discussed with regard to separation distance between zero-dimensional structures 210A-B.

If a reverse bias (i.e. a voltage configured to increase the depletion region of the energy band of the semiconductor material) is applied to the Schottky diode 300, the aluminum 314 and titanium 312 can function as a first plate of a capacitor, and the doped gallium arsenide 308 can function as a second plate of a capacitor, and can generate an electric field across the region between them. The electric field can couple a quantum state of the quantum dot that includes quantum dot material 302A with a quantum state of a combination of the quantum dot that includes quantum material 302B and other layers of semiconductor material (e.g., intrinsic gallium arsenide 304A-D, aluminum gallium arsenide 307, or doped gallium arsenide 308).

Figure 4A:
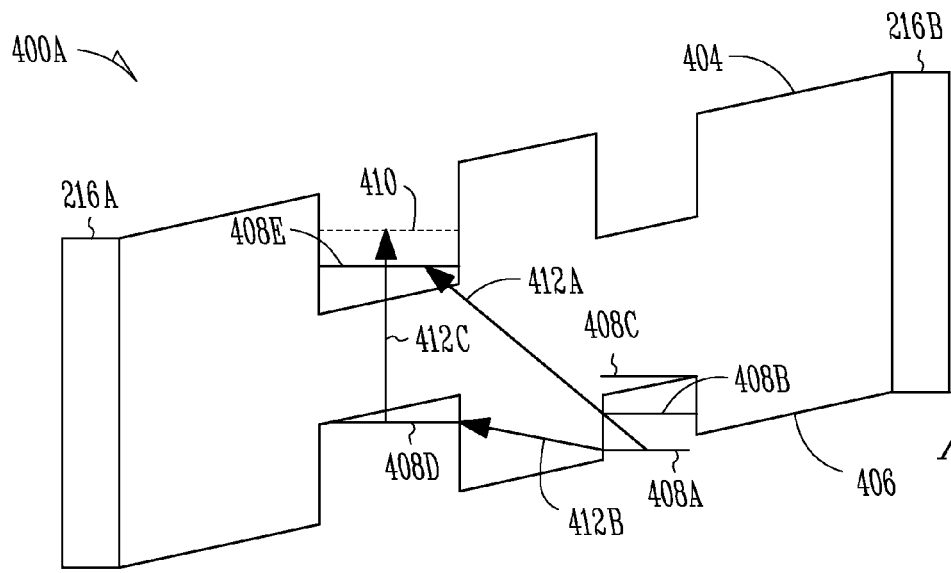
FIGS. 4A, 4B, and 4C show examples of an energy level band diagram of a medium and zero-dimensional structure pair.
Figure 4B:
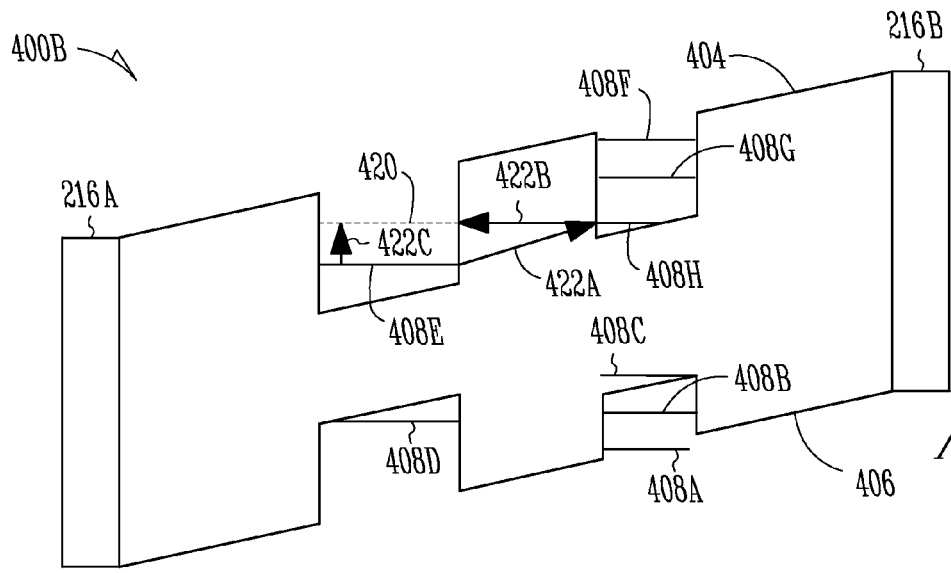
Figure 4C:
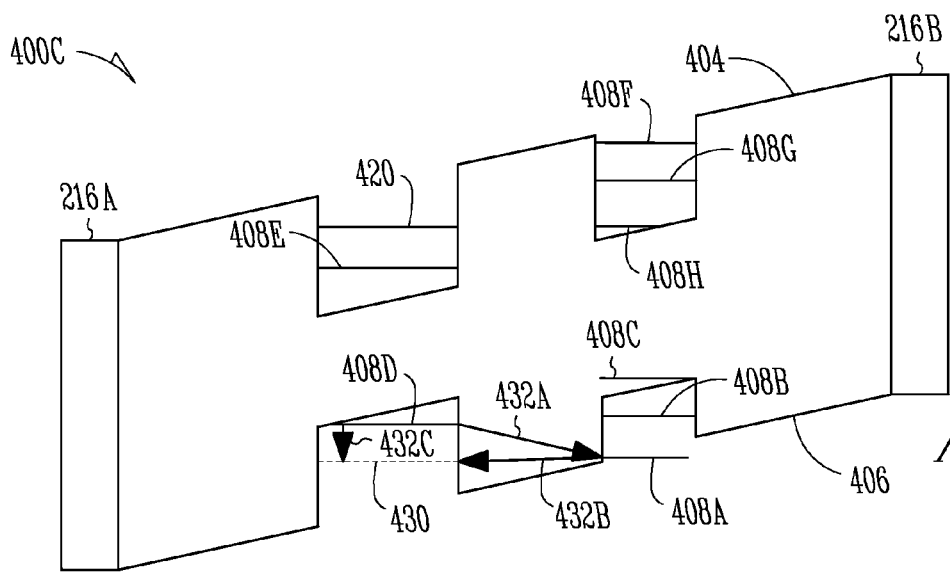

FIGS. 4A, 4B, and 4C show examples of energy level band diagrams 400A, 400B, and 400C, respectively, of a medium and quantum dot pair, such as the semiconductor material 212 and zero dimensional structures 210A-B. The energy level band diagrams 400A, 400B, and 400C include a conduction band edge 404 and a valence band edge 406. The energy level band diagram 400A includes electronic states 408A, 408B, 408C, and 408D, and a state 410 that includes phonons and is dashed (e.g., a state in which a phonon is bound to one or more charges, such as an electron or a hole). An electric field caused by a bias applied to the structure 200 can lift or lower the potential on the contact 216B and can keep the potential on the contact 216A fixed (e.g., grounded or at some other potential). The potential difference can cause the valence band edge 406 and conduction band edge 404 to skew, such as shown in FIGS. 4A-C. The skewing can allow for discrete energy levels of the zero-dimensional structure 210A to be shifted with respect to the energy level of the zero-dimensional structure 210B. The two areas where the conduction band edge 404 is closer to the valence band edge 406 are where the electric field is interacting with a zero-dimensional structure 210A-B, respectively.

A transition 412A, 412B, or 412C between states of the zero-dimensional structures 210A-B can occur when energy is provided to the zero-dimensional structures 210A-B. The transition 412A indicates a change from a state in a valence band energy level of the zero-dimensional structure 210B to a state in a conduction band energy level of the zero-dimensional structure 210A. The transition 412B indicates electron or hole tunneling between the zero-dimensional structures 210A-B. A phonon can be generated in this transition 412B. The transition 412C indicates a change from a valence band energy level of the zero-dimensional structure 210A to the conduction band energy level at state 410 that can include a phonon. At the state 410, tunneling between the zero-dimensional structures 210A-B can occur.

In one or more embodiments, the initial state 102 can correspond to a state where all electrons are in the valence band 406 and no electrons are in the conduction band 404. The continuum state 106 can be entered when an electron transitions from state 408D to state 410. The discrete state 104 can be entered when an electron transitions from state 408A to state 408E, such as is shown by the transition 412A. The final state 108 can be entered when an electron transitions from state 408D to 408E or when an electron transitions from state 410 to state 408E, such as by emitting or releasing a phonon. The states 408B-C can be alternative states for state 408A that are at a different energy. These states 408B-C can be accessed by applying a different electric potential to the contacts 216A-B of the respective device.

In one or more embodiments, the initial state 102 can include empty zero-dimensional structures 212A-B (neither a hole nor an electron in the zero-dimensional structure 212A-B), the continuum state 106 can include a zero-dimensional structure 212A-B in a polaron state ($|X_0,\Omega>$), the discrete state 104 can include an inter-zero-dimensional structure 212-A-B exciton state (a hole in one zero-dimensional structure 210B and an electron in the other zero-dimensional structure 210A), and the final state 108 can include a zero-dimensional structure 212A-B exciton state and a phonon released or unbound to the zero-dimensional structure 212A-B.

In one or more embodiments, the initial state 102 can correspond to a state where one or more electrons are in the conduction band 404 and no holes are in the valence band 406. The continuum state 106 can be entered when an electron transitions from state 408D to state 410. The discrete state 104 can be entered when an electron transitions from state 408A to state 408E, such as shown by the transition 412A. The final state 108 can be entered when an electron transitions from state 408D to 408E or when an electron transitions from state 410 to state 408E, such as by emitting a phonon.

In one or more embodiments, the initial state 102 can correspond to a state where one or more holes are in the valence band 406 and no electrons are in the conduction band 404. The continuum state 106 can be entered when an electron transitions from state 408D to state 410. The discrete state 104 can be entered when an electron transitions from state 408A to state 408E, such as is shown by the transition 412A. The final state 108 can be entered when an electron transitions from state 408D to 408E or when an electron transitions from state 410 to state 408E, such as by emitting a phonon.

In one or more embodiments, the initial state 102 can include a charged zero-dimensional structure 212A-B (e.g., a zero-dimensional structure 212A-B with one or more holes or electrons therein). The continuum state 106 can include a zero-dimensional structure 212A-B in a polaron state ($|Ch,\Omega>$). The discrete state 104 can include an inter-zero-dimensional structure 212-A-B charge state (e.g., one of the holes or electrons in one zero-dimensional structure 210B and the remaining holes or electrons (if any) in the other zero-dimensional structure 210A). The final state 108 can include a zero-dimensional structure 212A-B charge state and a phonon released or unbound to the zero-dimensional structure 212A-B.

In one or more embodiments, the initial state 102 can correspond to a state where zero or more electrons are in the conduction band 406 and zero or more holes are in the valence band 404. The continuum state 106 can be entered when an electron transitions from state 408E to state 420, such as by binding a phonon or interacting with an electric field. The discrete state 104 can be entered when an electron transitions from state 408E to state 408H, such as is shown by the transition 422A, or an electron is supplied by an electric lead directly to state 408H. The final state 108 can be entered when an electron transitions from state 408H to 408E or when an electron transitions from state 420 to state 408E by emitting a phonon. The states 408F-G can be alternative states for state 408H that are at different energy. These states 408F-G can be accessed by applying a different electric potential to the contacts 216A-B of the respective device.

In one or more embodiments, the initial state 102 can correspond to a state where zero or more holes are in the valence band 406 and zero or more electrons are in the conduction band 404. The continuum state 106 can be entered when a hole transitions from state 408D to state 430 by binding a phonon or when a hole is supplied by a lead. The discrete state 104 can be entered when a hole transitions from state 408D to state 408A, such as is shown by the transition 432A, or a hole is directly supplied by an electric lead to state 408A. The final state 108 can be entered when a hole transitions from state 408A to 408D or when a hole transitions from state 420 to state 408D, such as by emitting a phonon.

In one or more embodiments, the initial state 102 can include spins in the zero-dimensional structures 212A-B (e.g., one or more spin polarized holes or electrons in the zero-dimensional structure 212A-B). The continuum state 106 can include a zero-dimensional structure 212A-B in a spin polarized polaron state ($|S,\Omega>$). The discrete state 104 can include an inter-zero-dimensional structure 212-A-B charge state (e.g., one of the spin polarized holes or electrons in one zero-dimensional structure 210B and the remaining holes or electrons (if any) in the other zero-dimensional structure 210A). The final state 108 can include a zero-dimensional structure 212A-B spin state and a phonon released or unbound to the zero-dimensional structure 212A-B.

In one or more embodiments, the initial state 102 can correspond to a state where zero or more spin polarized electrons are in the conduction band 406 and zero or more holes are in the valence band 404. The continuum state 106 can be entered when a spin polarized electron transitions from state 408E to state 420 by binding to a phonon or when an energy is supplied by a spintronic lead (e.g., the lead element 224). The discrete state 104 can be entered when a spin polarized electron transitions from state 408E to state 408H, such as is shown by the transition 422A, or a spin polarized electron is supplied by a spintronic lead element (e.g., a spin injector). The final state 108 can be entered when a spin polarized electron transitions from state 408H to 408E or when an electron transitions from state 420 to state 408E, such as by emitting a phonon. The states 408F-G can be alternative states for state 408H that are at different energy. These states 408F-G can be accessed by applying a different electric potential to the contacts 216A-B of the respective device.

In one or more embodiments, the initial state 102 can correspond to a state where zero or more spin polarized holes are in the valence band 406 and zero or more electrons are in the conduction band 404. The continuum state 106 can be entered when a spin polarized hole transitions from state 408D to state 430 by binding a phonon or a spin polarized hole is supplied by a spintronic lead directly to state 430. The discrete state 104 can be entered when a spin polarized hole transitions from state 408D to state 408A, such as is shown by the transition 432A, or a spin polarized hole is supplied by a spintronic lead directly to state 408A. The final state 108 can be entered when a hole spin transitions from state 408A to 408D or when a spin polarized hole transitions from state 420 to state 408D by emitting a phonon.

As previously discussed, the initial state 102 can be bypassed, such as by injecting an electron or hole (e.g., a polarized electron or hole) through the lead element 224.

Figure 5:
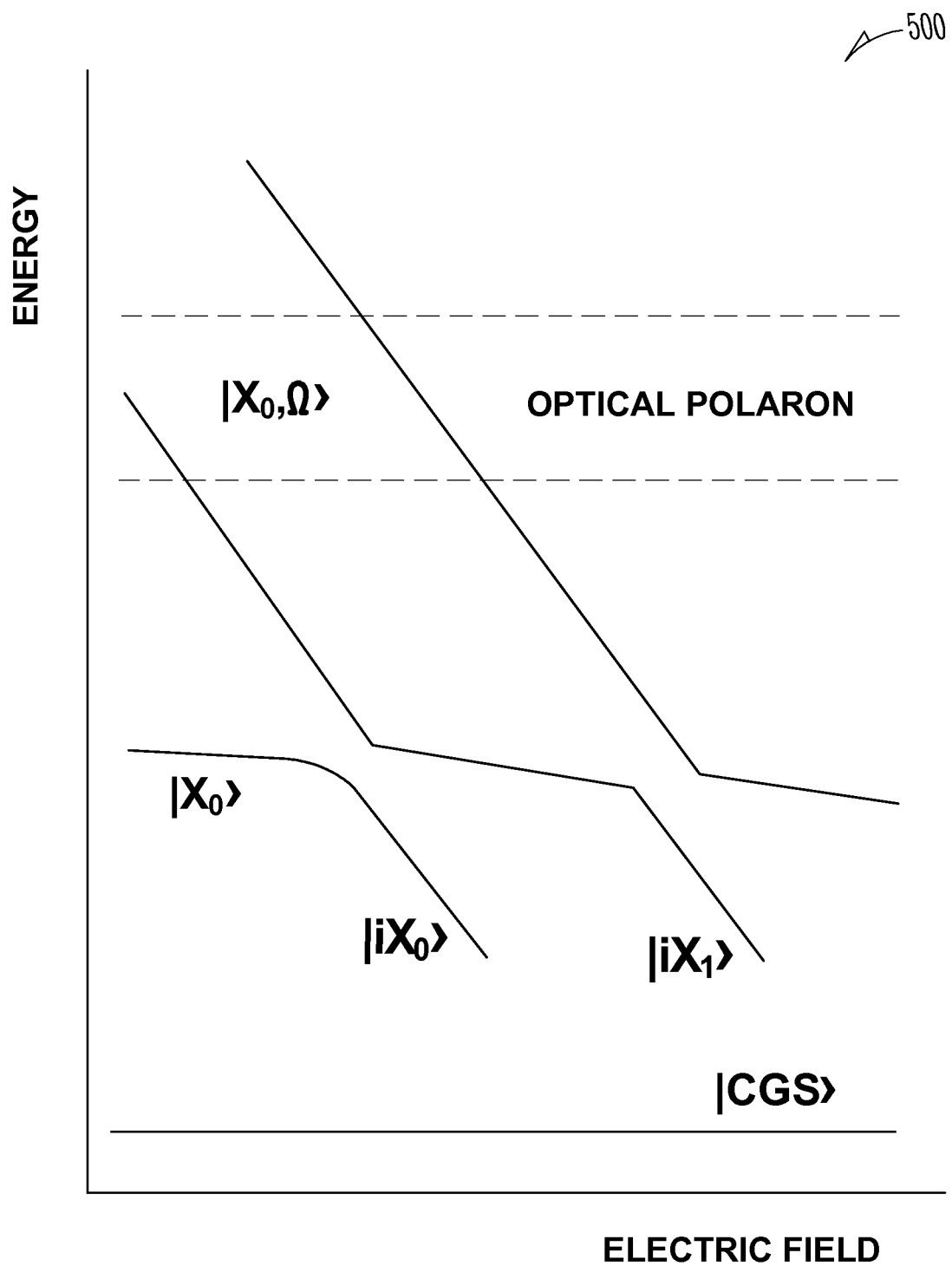
FIG. 5 shows an example of a line graph of energy vs. electric field for a neutral exciton.

FIG. 5 shows an example of a line graph 500 of energy vs. electric field for a neutral exciton (an electron in the conduction band and a hole in the valence band). $|X_0\rangle$ represents a ground state exciton where both charges are in the zero-dimensional structure 210A. $|iX_0\rangle$ and $|iX_1\rangle$ represent respective exciton states where the hole is in the ground or first excited level of the zero-dimensional structure 210A valence band. $|X_0,\Omega\rangle$ represents a state in the polaron continuum (e.g., a weakly bound state formed by a phonon $\Omega$ and the zero-dimensional structure's 210B ground state exciton. While this discussion regards optical phonons, acoustic phonons could be used as well. Using an electric field the $|iX_0\rangle$ and $|iX_1\rangle$ states can be tuned in resonance (e.g., coupled) with the $|X_0,\Omega\rangle$ state. If either the $|iX_0\rangle$ or $|iX_1\rangle$ are substantially coupled to $|X_0, \Omega\rangle$, a which-path problem can be created. The coupling can cause a resonant or molecular polaron to be formed. The coupling can be caused by quantum mechanical tunneling of charges between the zero-dimensional structures 210A-B. The $|X_0, \Omega\rangle$, $|iX_0\rangle$, and $|iX_1\rangle$, states can be induced by an excitation energy, such as electronic, optical, acoustic, or phononic excitation energy. The $|CGS\rangle$ indicates a crystalline ground state or an unperturbed device 200 state.

Figure 6:
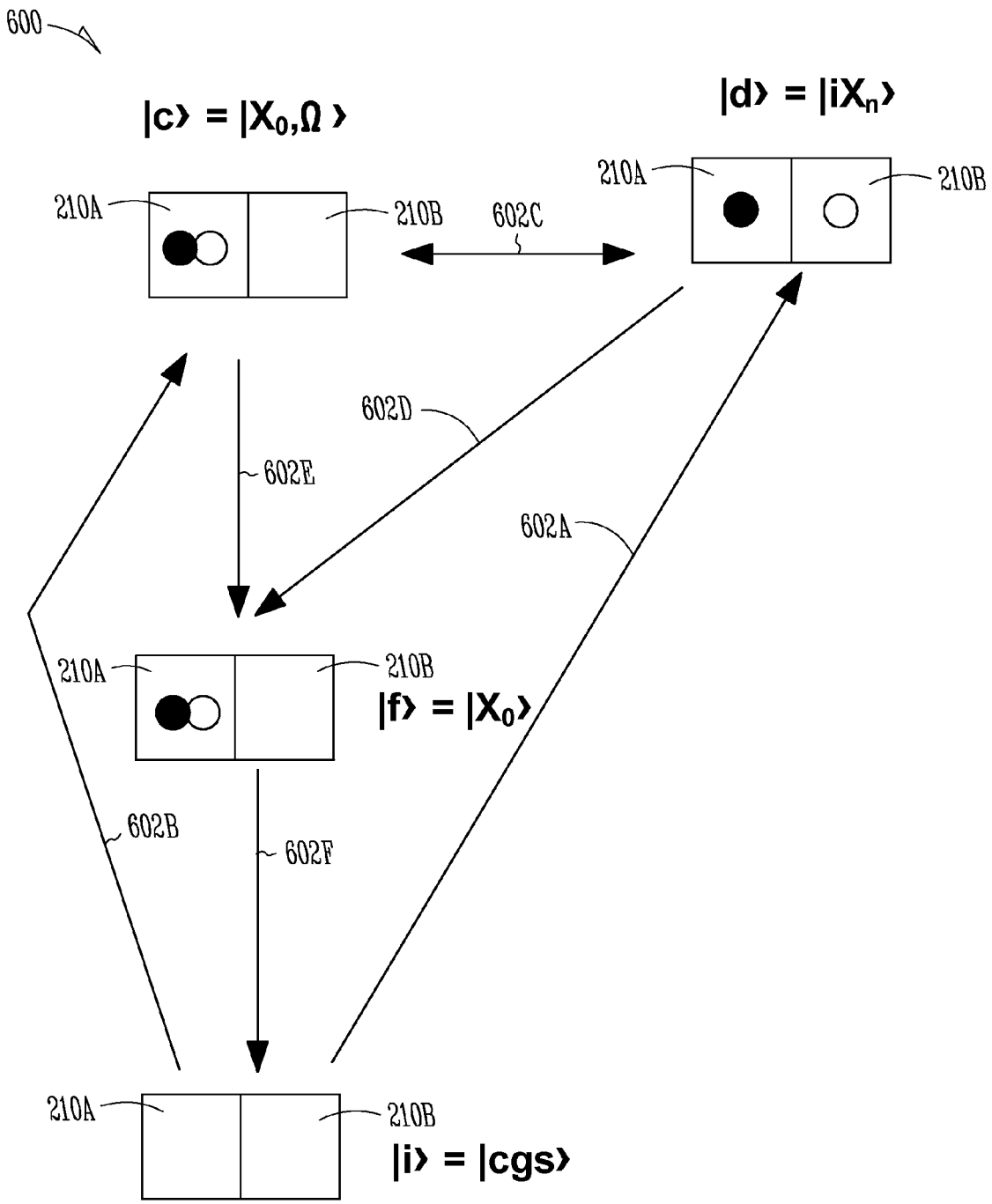
FIG. 6 shows an example of a state diagram of a medium and quantum dot pair.

FIG. 6 shows an example of a transition diagram 600 between states of a medium and quantum dots, such as the semiconductor material 212 and the zero-dimensional structures 210A-B. The zero-dimensional structure 210A is represented by the left box of each pair of boxes and the zero-dimensional structure 210B is represented by the right box of each pair of boxes. A dark dot in the box indicates an electron is present in the associated zero-dimensional structure 210A-B and a light dot indicates a hole is present in the associated zero-dimensional structure 210A-B. Thus, a dark dot in the left box indicates that the electron is present in the zero-dimensional structure 210A.

At $|i\rangle$, which is representative of a crystalline ground state ($|cgs\rangle$) or the initial state 102, neither zero-dimensional structure 210A-B may include the electron or hole. At 602A, the state can transition from a cgs to a state $|d\rangle=|iX_n\rangle$ (e.g., the discrete state 104), where n indicates the energy band level of the zero-dimensional structure 210A-B, that includes an indirect exciton (electron and hole in separate zero-dimensional structures 210A-B). The transition at 602A can be the same as the transition 412A. At 602B, the state can transition from a cgs state to a state $|c\rangle=|X_0,\Omega\rangle$ (e.g., the continuum state 106), that includes a polaron (a phonon and electron and hole in the same zero-dimensional structures 210A-B). The transition at 602B can correspond to a charge (e.g., electron or hole) transitioning into the zero-dimensional structure 210A while a phonon is created or bound to the charge. The transition at 602C can correspond to a hole transitioning into the zero-dimensional structure 210A when a phonon has been released or unbounded. At 602C, tunneling of the electron or hole can occur. This tunneling indicates that the phonon can be preserved in the structure (e.g., not dissipated or localized) through state $|iX_n\rangle$. The phonon can be released or unbounded at $|X_0\rangle$. The transition at 602C can correspond to the transition 412B. At 602D, the state can transition from the $|d\rangle=|iX_n\rangle$ state to the state $|f\rangle=|X_0\rangle$ (e.g., the final state 108). The transition at 602D can correspond to a hole transitioning from state 408A to the state 408D while a phonon is being released or unbound. At 602E, the state can transition from the state $|c\rangle=|X_0,\Omega\rangle$ discrete state 104 to the state $|f\rangle=|X_0\rangle$. The transition at 602E can correspond to a phonon being released or unbound from the state 410 taking the zero-dimensional structure 210A-B to the state 408E. At 602F, the state can transition from $|f\rangle=|X_0\rangle$ to $|i\rangle=|cgs\rangle$. The transition at 602F can correspond to a transition from the state 408E to the state 408D. As used herein "state" refers to the state of the zero-dimensional structures 210A-B with or without the semiconductor material 212.

At 602F, a photon can be emitted and the zero-dimensional structures 210A-B can return to CGS from state $|f\rangle$. Detection of the photon emission can provide a means by which to verify phonon generation or a lack thereof. The state $|f\rangle$ can be the final state 108, the state $|i\rangle$ can be the initial state 102, the state $|c\rangle$ can be the continuum state 106, and the state $|d\rangle$ can be the discrete state 104 (see FIG. 1). The coupling 110 between the discrete state 104 and the continuum state 106 (e.g., a coherent phonon) can be provided by the tunneling at 602C.

Figure 7:
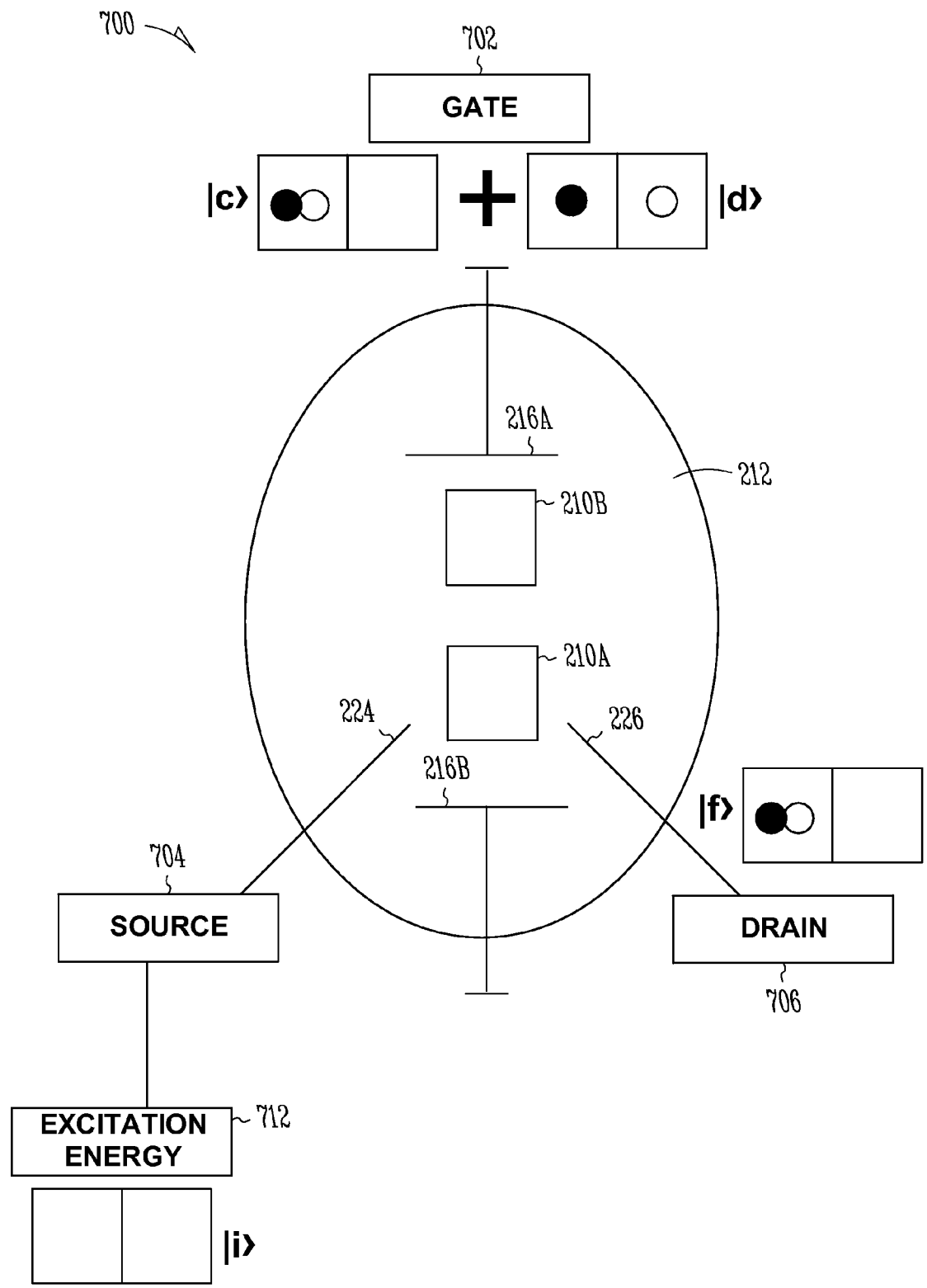
FIG. 7 shows an example of a phonon transistor that includes a pair of zero-dimensional structures.

FIG. 7 shows an example of a phonon transistor 700. The phonon transistor 700 can include a gate 702, a source 704, and a drain 706. The gate 702 can include a coupling between the continuum and discrete states ($|c\rangle$ and $|d\rangle$).

The gate 702 can include the contacts 216A-B, such as to provide a structure through which an electric field can be provided to the zero-dimensional structures 210A-B.

The source 704 can include an uncoupled discrete or continuum state. The source 704 can include a lead element 224 coupled to the semiconductor material 212. The lead element 224 can be configured to provide excitation energy, such as from a means for providing excitation energy 712 to the semiconductor material 212. The lead element 224 can be an optical, acoustic, electrical, spintronic, or phononic lead element. The lead element 224 can be an optical fiber, photonic wave guide, the aperture 316, an electrically conductive wire, or other phononic waveguide. The lead element 224 can include a heat transfer mechanism configured to provide heat energy to the semiconductor material 212. The lead element 224 can be coupled to the means for providing excitation energy 712 to the semiconductor 212. The means for providing excitation energy 712 can include a laser or an electrical power supply. The means for providing excitation energy 712 can provide energy to transition the state from the initial state ($|i\rangle$) to the discrete state or continuum state which are either coupled or uncoupled, such as depending on what bias is applied to the gate 702 and the resulting electric field generated between contacts 216A and 216B.

The drain 706 can include the final state (|f>) of the zero-dimensional structures 210A-B. The drain 706 can include a lead element 226 configured to transport a phonon therethrough. The lead element 226 can be a phononic wave guide or a combination with one or more of a photonoic waveguide, the aperture 316, an electrically conductive wire, or a spintronic lead element. A phonon emitted through the lead element 226 can be determined, at least in part, by the electric bias applied to the contacts 216A-B or the excitation energy provided through the lead element 224.

Figure 8:
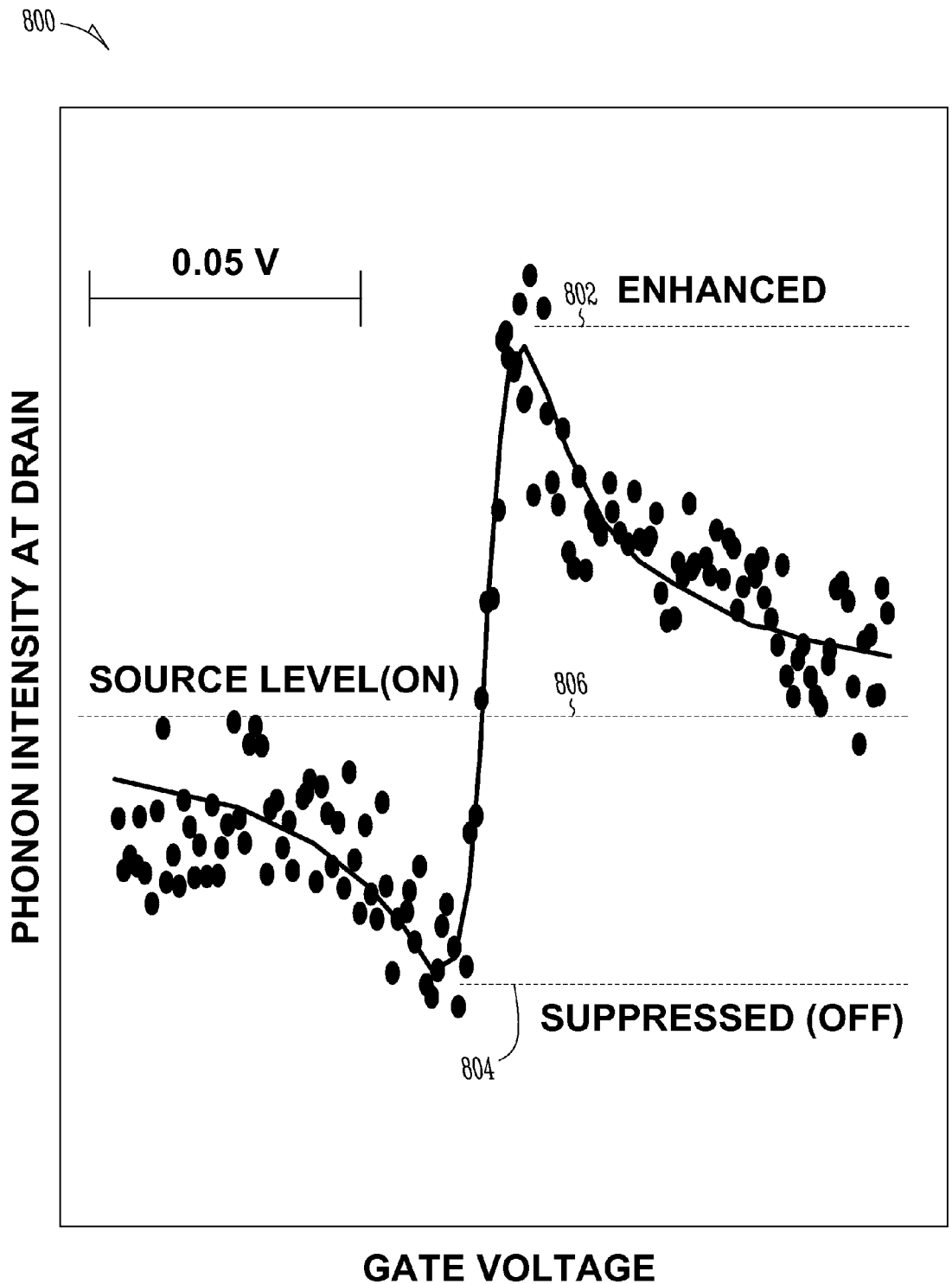
FIG. 8 shows an example of a scatter plot and line graph of phonon intensity at the drain of the transistor of FIG. 7 vs. the voltage at the gate of the transistor.

FIG. 8 shows an example of a scatter plot and line graph 800 of phonon intensity at the drain 706 versus a voltage applied at the gate 702. The scatter plot 800 shows a region indicated by the space above dotted line 806 and below dotted line 802 where phonon generation can be enhanced (e.g., increased). The space above the dotted line 806 can be where constructive interference between quantum states of the zero-dimensional structures 210A-B can be produced. The scatter plot 800 shows a region indicated by the space below dotted line 806 and above the dotted line 804 where phonon generation can be suppressed (e.g., decreased). The space below the dotted line 806 can be where destructive interference between quantum states of the zero-dimensional structures 210A-B can be produced. A gating mechanism of a phonon control mechanism (e.g., phonon transistor or phonon FET) can help enhance or suppress the generation of phonons, such as by changing or controlling the gate voltage or electric bias applied to the contacts 216A-B. The scatter plot 800 shows a region indicated by the space above dotted line 806 where the source 704 is producing or generating a phonon, such as an enhanced number or greater number of phonons.

FIGS. 9A and 9B show scatter plots 900A and 900B of intensity versus gate voltage. As can be seen, a variety of transistor-like switching characteristics can be achieved by varying the excitation energy, such as shown in FIG. 9A, or the excitation power density, such as shown in FIG. 9B, at the source 704 or the gate voltage at the gate 702. As used herein, "intensity" can be the number of phonons that pass through the drain of the respective phonon control device or mechanism. In this regard, a high intensity can mean that a high number of phonons is dissipated or pass through the drain 706 (e.g., the lead element 226).

Figure 10:
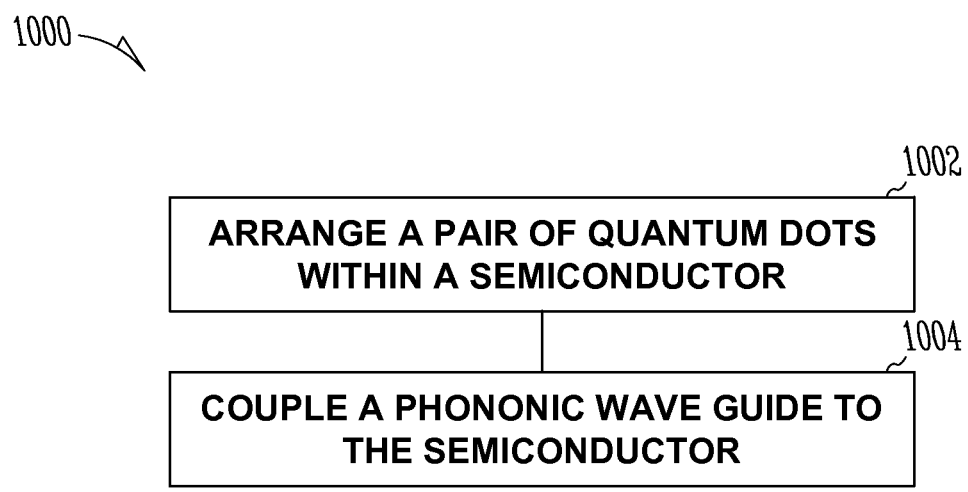
FIG. 10 shows a flow diagram of an example of a technique for making a phonon control mechanism.

FIG. 10 shows a flow diagram of an example of a technique 1000 for making a phonon control mechanism. At 1002, a pair of quantum dots can be arranged within a semiconductor. The quantum dots can be arranged such that quantum states of the pair of quantum dots resonate in the presence of an electric field. Arranging the two quantum dots can include situating a first quantum dot material over a substrate of the semiconductor so as to form a first quantum dot of the pair of quantum dots and situating a second quantum dot material over the first quantum dot material so as to form a second quantum dot of the pair of quantum dots. The first or second quantum dot material or the intrinsic material can include the same materials as the semiconductor material 212 or the additive. At 1004, a phononic wave guide can be coupled to the semiconductor.

The technique 1000 can include coupling an optical, electrical, or phononic lead to the semiconductor. The technique can include situating a layer of intrinsic material over the substrate, wherein the first and second quantum dot material are separated by the layer of intrinsic semiconductor material. The intrinsic semiconductor material can separate the first and second quantum dot material by less than one hundred nanometers.

Figure 11:
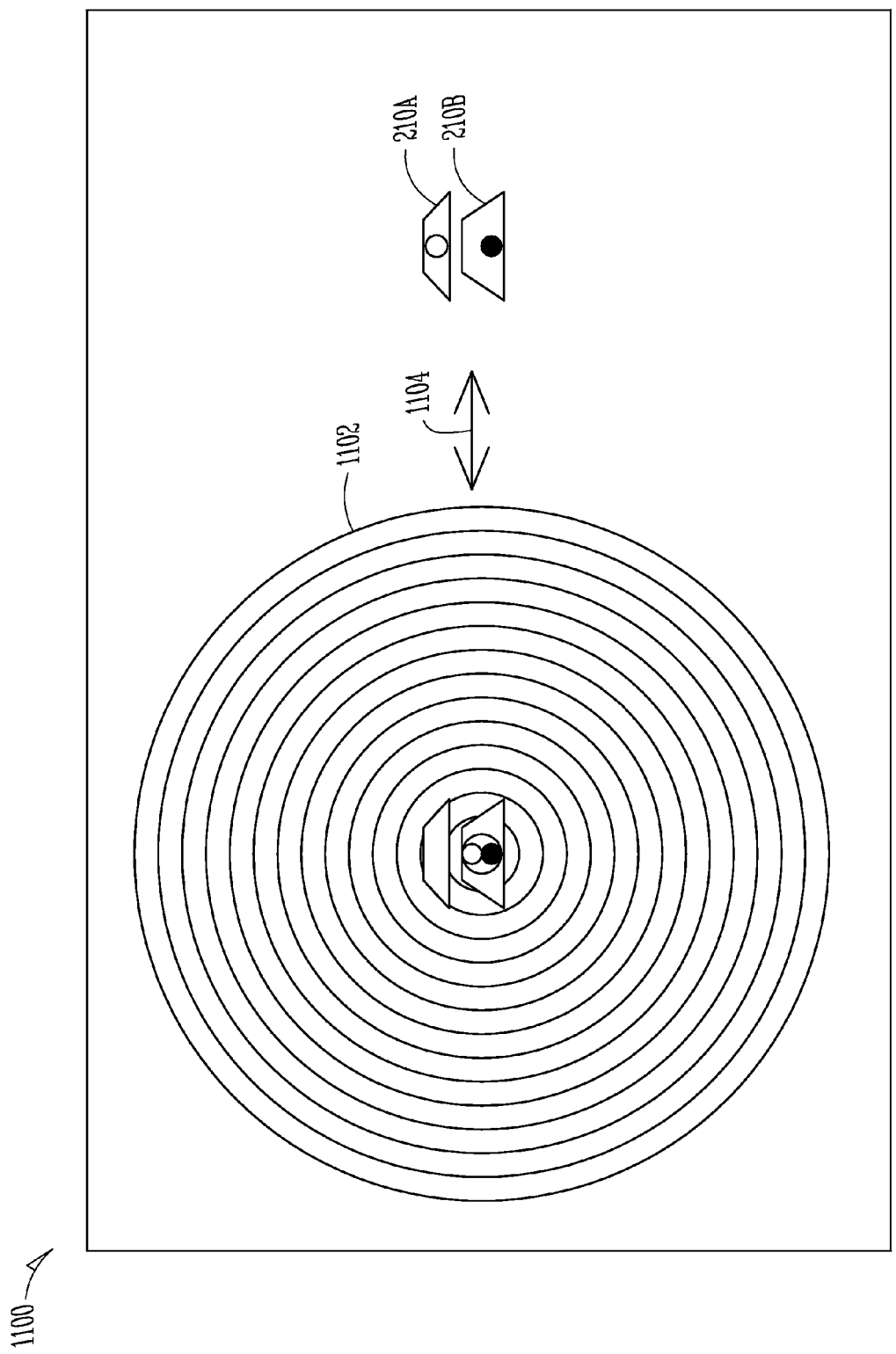
FIG. 11 shows a block diagram of an example of a strain or motion sensor.

FIG. 11 shows a block diagram of an example of a strain or motion sensor device 1100 that uses phonon properties to determine strain or motion within a substrate. Lattice vibrations (represented by the concentric rings 1102) can be coherently tied to the zero-dimensional structures 210A-B (tie represented by the arrow 1104) due to a resonance with an |iX> state. Consider the control mechanism 200 that includes a source lead element 224 that can provide excitation energy to the zero-dimensional structures 210A-B from a light source. In an unstrained (e.g., unperturbed) substrate, the molecular polaron exists unperturbed for a certain amount of time, also called the "coherence time". The longer the coherence time, the larger the volume of the substrate the molecular polaron interacts with or senses. Strain in the substrate changes the frequency spectrum of the phonons supported by the material, thus changing the molecular polaron and causing decoherence or a shortened coherence time. The coherence time of a phonon can be increased by increasing the optical power of the light source.

This effect can be seen by analyzing a phonon-induced transparency signal (e.g., depth or spectral width of the phonons, such as shown in FIG. 8). Motion or strain in the substrate can then be derived from the transparency signal. Strain in the substrate can be the result of a defect in the substrate, a deformation (e.g., a bending) of the substrate. The deformation can be caused by an acceleration gravitational pull, or in general motion of the substrate. Thus, the phonon control mechanism discussed herein could be used in an accelerometer, a gradiometer, power sensor, strain gauge, or other strain or motion device.

ADDITIONAL NOTES AND EXAMPLES

One or more aspects of the disclosure may be understood through one or more Example embodiments.

Example 1 can include or use subject matter (such as an apparatus including a processor configured to perform acts, a method, a means for performing acts, or a device readable memory including instructions that, when performed by the device, can cause the device to perform acts), such as can include or use electrical contacts, two quantum dots embedded in a semiconductor such that when an electrical bias is applied to the electrical contacts, an electric field produced by the electrical bias is substantially parallel to an axis through the two quantum dots, and a phononic wave guide coupled to the semiconductor, the phononic wave guide configured to transport a phonon therethrough.

Example 2 can include or use, or can optionally be combined with the subject matter of Example 1, to include or use a lead configured to provide excitation energy to the semiconductor, wherein the lead is an optical lead, an electrical lead, or a phononic lead.

Example 3 can include or use, or can optionally be combined with the subject matter of at least one of Examples 1-2, to include or use wherein an electric field line of the electric field is coaxial with the axis through the two quantum dots.

Example 4 can include or use, or can optionally be combined with the subject matter of at least one of Examples 1-3, to include or use wherein the phonon is coherent and non-dissipative in the presence of the electric field.

Example 5 can include or use, or can optionally be combined with the subject matter of at least one of Examples 1-4, wherein the phonon is coherent and non-dissipative depending on presence or absence of the electric field.

Example 6 can include or use, or can optionally be combined with the subject matter of at least one of Examples 1-5, wherein the phonon is localized in a quantum dot of the two quantum dots dependent on the applied electric field.

Example 7 can include or use, or can optionally be combined with the subject matter of at least one of Examples 1-6, to include or use wherein the two quantum dots are spaced apart so as to create a polaron and an indirect exciton in the presence of the electric field.

Example 8 can include or use, or can optionally be combined with the subject matter of at least one of Examples 1-7, to include or use wherein the two quantum dots include a first and second quantum dot, wherein the first quantum dot and the semiconductor provide a continuum state, wherein the second quantum dot provides a discrete state, wherein the continuum state and the discrete state are coupled when the electrical bias is applied to the electrical contacts, and wherein the electrical bias provides a gating mechanism for the coupling such that when the electrical bias includes a first electro potential the electric field inhibits the generation or transmission of phonons and when the electrical bias includes a second electro potential different from the first electro potential, the electrical field promotes the generation or transmission of phonons.

Example 9 can include or use, or can optionally be combined with the subject matter of at least one of Examples 1-8, to include or use wherein a phonon emitted through the phononic waveguide is determined by the electric field.

Example 10 can include or use, or can optionally be combined with the subject matter of at least one of Examples 2-9, wherein a number of phonons transported or generated can be adjusted by adjusting excitation energy, spectral width, power density, coherence of the excitation energy, or duration of the excitation energy.

Example 11 can include or use subject matter (such as an apparatus including a processor configured to perform acts, a method, a means for performing acts, or a device readable memory including instructions that, when performed by the device, can cause the device to perform acts), such as can include or use arranging a pair of quantum dots within a semiconductor such that quantum states of the pair of quantum dots resonate in the presence of an electric field, and coupling a phononic wave guide to the semiconductor.

Example 12 can include or use, or can optionally be combined with the subject matter of Example 11, to include or use coupling an optical, electrical, or phononic lead to the semiconductor.

Example 13 can include or use, or can optionally be combined with the subject matter of at least one of Examples 11-12, to include or use wherein arranging the two quantum dots includes situating a first quantum dot material horizontally adjacent to a second quantum dot material using a site controlled growth technique.

Example 14 can include or use, or can optionally be combined with the subject matter of at least one of Examples 11-12, to include or use wherein arranging the two quantum dots includes situating a first quantum dot material over a substrate of the semiconductor so as to form a first quantum dot of the pair of quantum dots and situating a second quantum dot material over the first quantum dot material so as to form a second quantum dot of the pair of quantum dots.

Example 15 can include or use, or can optionally be combined with the subject matter of Example 14, to include or use situating a layer of intrinsic material over the semiconductor substrate, wherein the first and second quantum dot material are separated by the layer of intrinsic semiconductor material.

Example 16 can include or use, or can optionally be combined with the subject matter of at least one of Examples 11-15, to include or use wherein the first quantum dot material includes indium arsenide.

Example 17 can include or use, or can optionally be combined with the subject matter of at least one of Examples 15-16, to include or use wherein the intrinsic semiconductor material includes gallium arsenide or other intrinsic semiconductor.

Example 18 can include or use, or can optionally be combined with the subject matter of at least one of Examples 15-17, to include or use wherein the intrinsic semiconductor material separates the first and second quantum dot material by less than one hundred nanometers.

Example 19 can include or use subject matter (such as an apparatus including a processor configured to perform acts, a method, a means for performing acts, or a device readable memory including instructions that, when performed by the device, can cause the device to perform acts), such as can include or use a means for providing excitation energy, a phonon transistor coupled to the means for providing excitation energy. The phonon transistor can include (1) an electrically conductive medium, (2) first and second electrically conductive elements electrically coupled to the electrically conductive medium, the first and second electrically conductive elements configured to provide an electric potential to the electrically conductive medium when the electric potential is applied to the first and second conductive elements, (3) first and second quantum dots embedded in the electrically conductive medium such that in the presence of an electric field provided by the electric potential, a state of the first quantum dot couples with a state of a combination of the second quantum dot and the electrically conductive medium, (4) a lead element coupled to the means for providing excitation energy, the lead element configured to provide the excitation energy to the electrically conductive medium, or (5) a first phononic wave guide coupled to the electrically conductive medium, the phononic wave guide configured to transport phonons generated within the electrically conductive medium.

Example 20 can include or use, or can optionally be combined with the subject matter of Example 19, to include or use wherein the means for providing excitation energy includes a laser and wherein the lead element includes an optical fiber.

Example 21 can include or use, or can optionally be combined with the subject matter of at least one of Examples 19-20, to include or use wherein the means for providing excitation energy includes an electrical power supply and the lead element includes a wire.

Example 22 can include or use, or can optionally be combined with the subject matter of at least one of Examples 19-21, to include or use wherein the lead element includes a second phononic wave guide.

Example 23 can include or use, or can optionally be combined with the subject matter of at least one of Examples 19-22, to include or use wherein the electric field is substantially parallel to an axis through the first and second quantum dots.

Example 24 can include or use, or can optionally be combined with the subject matter of at least one of Examples 19-23, wherein the electrically conductive medium includes a semiconductor diode.

Example 25 can include of use, or can optionally be combined with the subject matter of at least one of Examples 19-24, wherein the first and second quantum dots are encapsulated in an electrically insulating material that is configured to shield the first and second quantum dots from direct contact with the electrically conductive medium.

Although an overview of the subject matter has been described with reference to specific embodiments, various modifications and changes may be made to these embodiments without departing from the broader spirit and scope of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Moreover, plural instances may be provided for resources, operations, or structures described herein as a single instance. Additionally, boundaries between various resources, items with reference numbers, or operations, are somewhat arbitrary, and particular operations are illustrated in a context of specific illustrative configurations. Other allocations of functionality are envisioned and may fall within a scope of various embodiments of the present invention. In general, structures and functionality presented as separate resources in the example configurations may be implemented as a combined structure or resource. Similarly, structures and functionality presented as a single resource may be implemented as separate resources.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

These and other variations, modifications, additions, and improvements fall within a scope of the inventive subject matter as represented by the appended claims. The specification and drawings are, accordingly, to be regarded in an illustrative rather than a restrictive sense.

What is claimed is:

1. A phonon transistor comprising:
   electrical contacts;
   two quantum dots embedded in a semiconductor such that when an electrical bias is applied to the electrical contacts, an electric field produced by the electrical bias is substantially parallel to an axis through the two quantum dots, wherein the two quantum dots include a first and second quantum dot, wherein the first quantum dot and the semiconductor provide a continuum state, wherein the second quantum dot provides a discrete state, wherein the continuum state and the discrete state are coupled when the electrical bias is applied to the electrical contacts, and wherein the electrical bias provides a gating mechanism for the coupling such that when the electrical bias includes a first electro potential the electric field inhibits the generation or transmission of phonons and when the electrical bias includes a second electro potential different from the first electro potential, the electrical field promotes the generation or transmission of phonons; and
   a phononic wave guide coupled to the semiconductor, the phononic wave guide configured to transport phonons therethrough.

2. The phonon transistor of claim 1, further comprising:
   a lead configured to provide excitation energy to the semiconductor, wherein the lead is an optical lead, an electrical lead, or a phononic lead.

3. The phonon transistor of claim 1, wherein an electric field line of the electric field is coaxial with the axis through the two quantum dots.

4. The phonon transistor of claim 1, wherein the phonon is localized in the quantum dots as a function of the electric field.

5. The phonon transistor of claim 4, wherein the two quantum dots are spaced apart so as to create a polaron and an indirect exciton in the presence of the electric field.

6. A phonon control system comprising:
   a means for providing excitation energy;
   a phonon transistor coupled to the means for providing excitation energy, the phonon transistor comprising:
   an electrically conductive medium;
   first and second electrically conductive elements electrically coupled to the electrically conductive medium, the first and second electrically conductive elements configured to provide an electric potential to the electrically conductive medium when the electric potential is applied to the first and second conductive elements;
   first and second quantum dots embedded in the electrically conductive medium such that in the presence of an electric field provided by the electric potential, a state of the first quantum dot couples with a state of a combination of the second quantum dot and the electrically conductive medium;
   a lead element coupled to the means for providing excitation energy, the lead element configured to provide the excitation energy to the electrically conductive medium; and
   a first phononic wave guide coupled to the electrically conductive medium, the first phononic wave guide configured to transport phonons generated within the electrically conductive medium.

7. The system of claim 6, wherein the means for providing excitation energy includes a laser and wherein the lead element includes an optical fiber.

8. The system of claim 6, wherein the means for providing excitation energy includes an electrical power supply and the lead element includes a wire.

9. The system of claim 6, wherein the lead element includes a second phononic wave guide.

10. The system of claim 6, wherein the electric field is substantially parallel to an axis through the first and second quantum dots.

11. The system of claim 6, wherein the electrically conductive medium includes a semiconductor diode.

\* \* \* \* \*